(12) United States Patent
Cheng

(10) Patent No.: US 9,831,333 B2
(45) Date of Patent: *Nov. 28, 2017

(54) HIGH-VOLTAGE NITRIDE DEVICE AND MANUFACTURING METHOD THEREOF

(71) Applicant: ENKRIS SEMICONDUCTOR, INC., Suzhou (CN)

(72) Inventor: Kai Cheng, Suzhou (CN)

(73) Assignee: Enkris Semiconductor, Inc., Suzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/247,044

(22) Filed: Aug. 25, 2016

(65) Prior Publication Data

US 2016/0365436 A1 Dec. 15, 2016

Related U.S. Application Data

(63) Continuation of application No. 14/820,552, filed on Aug. 6, 2015, now Pat. No. 9,455,315, which is a
(Continued)

(30) Foreign Application Priority Data

Feb. 7, 2013 (CN) .......................... 2013 1 0049853

(51) Int. Cl.
*H01L 29/778* (2006.01)
*H01L 29/205* (2006.01)
(Continued)

(52) U.S. Cl.
CPC ...... *H01L 29/7787* (2013.01); *H01L 21/0254* (2013.01); *H01L 21/02381* (2013.01);
(Continued)

(58) Field of Classification Search
CPC ............... H01L 29/7787; H01L 29/205; H01L 21/3065; H01L 21/0254; H01L 29/66462;
(Continued)

(56) References Cited

U.S. PATENT DOCUMENTS

2008/0048196 A1 2/2008 Strittmatter et al.
2011/0101370 A1 5/2011 Cheng et al.
2012/0223367 A1 9/2012 Kittler et al.

FOREIGN PATENT DOCUMENTS

CN 102569390 A 7/2012
CN 102769033 A 11/2012
(Continued)

OTHER PUBLICATIONS

SIPO Office Action for CN201310049853.X (priority application), dated Dec. 16, 2014.
(Continued)

*Primary Examiner* — William Coleman
(74) *Attorney, Agent, or Firm* — Flener IP Law; Zareefa B. Flener

(57) ABSTRACT

A high-voltage nitride device which can avoid vertical breakdown and has a high breakdown voltage includes: a silicon substrate; a nitride epitaxial layer, prepared on the silicon substrate; a positive electrode and a negative electrode, both of which are contacted with the nitride epitaxial layer; and at least one spatial isolation area, formed in a region between the silicon substrate and the nitride epitaxial layer vertically and between the positive electrode and the negative electrode horizontally.

23 Claims, 12 Drawing Sheets

Related U.S. Application Data continuation-in-part of application No. PCT/CN2014/070148, filed on Jan. 6, 2014.

(51) Int. Cl.

| | | |
|---|---|---|
| *H01L 29/66* | (2006.01) | |
| *H01L 21/02* | (2006.01) | |
| *H01L 21/306* | (2006.01) | |
| *H01L 21/3065* | (2006.01) | |
| *H01L 29/06* | (2006.01) | |
| *H01L 29/20* | (2006.01) | |
| *H01L 29/78* | (2006.01) | |
| *H01L 29/10* | (2006.01) | |

(52) U.S. Cl.
CPC .... *H01L 21/02458* (2013.01); *H01L 21/3065* (2013.01); *H01L 21/30612* (2013.01); *H01L 29/0649* (2013.01); *H01L 29/1083* (2013.01); *H01L 29/2003* (2013.01); *H01L 29/205* (2013.01); *H01L 29/66462* (2013.01); *H01L 29/66522* (2013.01); *H01L 29/78* (2013.01)

(58) Field of Classification Search
CPC ......... H01L 21/02458; H01L 21/30612; H01L 21/02381; H01L 29/78; H01L 29/66522; H01L 29/1083; H01L 29/2003; H01L 29/0649

See application file for complete search history.

(56) References Cited

FOREIGN PATENT DOCUMENTS

| | | |
|---|---|---|
| CN | 102916046 A | 2/2013 |
| JP | H0945762 A | 2/1997 |
| JP | 2007059595 A | 3/2007 |
| JP | 2009152349 A | 7/2009 |
| JP | 2011124514 A | 6/2011 |
| JP | 2012023211 A | 2/2012 |
| JP | 2012231003 A | 11/2012 |
| JP | 2013077822 A | 4/2013 |
| WO | 2013010828 A1 | 1/2013 |

OTHER PUBLICATIONS

JPO Office Action for JP2015-556382 (related foreign application), dated Aug. 8, 2016.
IP Office of Singapore (IPOS) Search Report for SG11201506228T (related foreign application), dated Apr. 22, 2016.
IP Office of Singapore (IPOS) Written Opinion for SG112015062281 (related foreign application), dated Apr. 22, 2016.

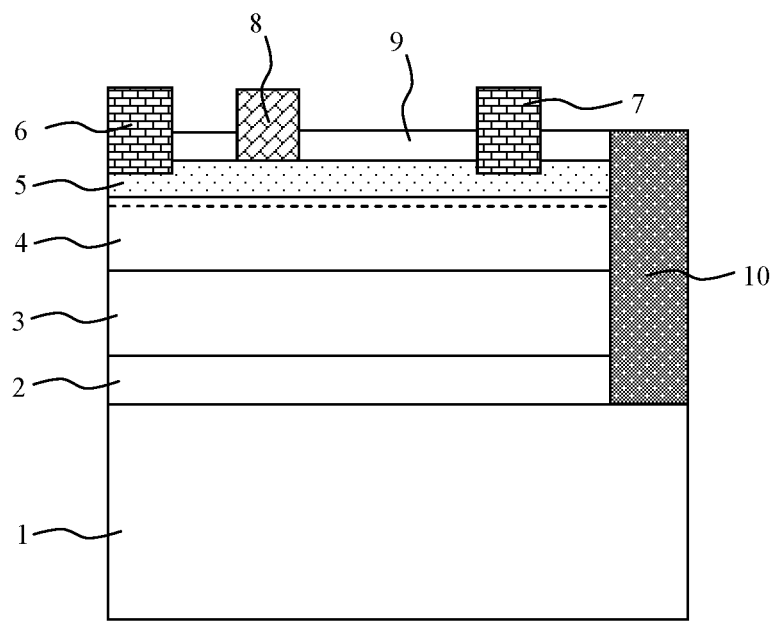
FIG.1-A
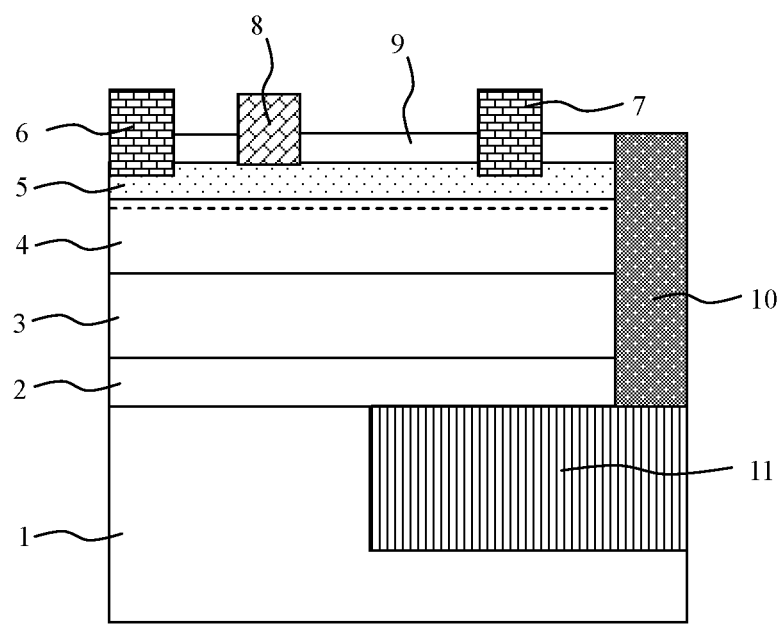
FIG.1-B

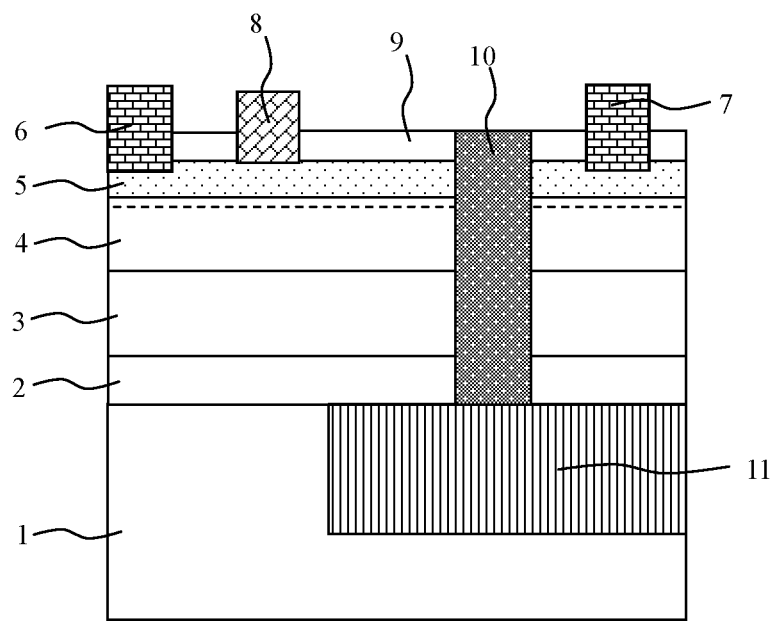
FIG.2-A
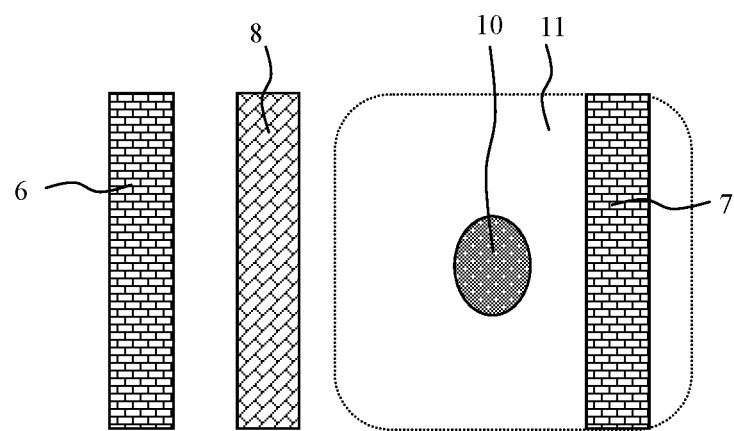
FIG.2-B

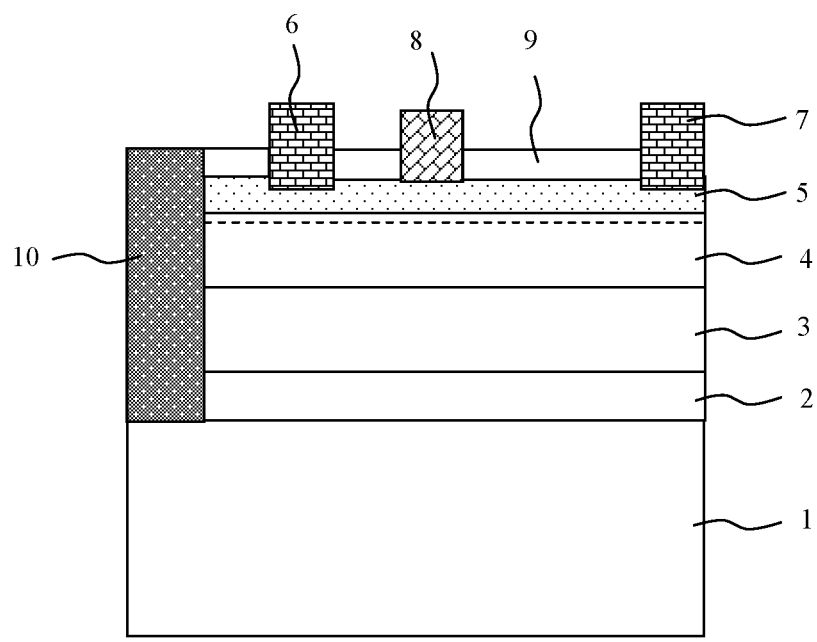
FIG.15-A
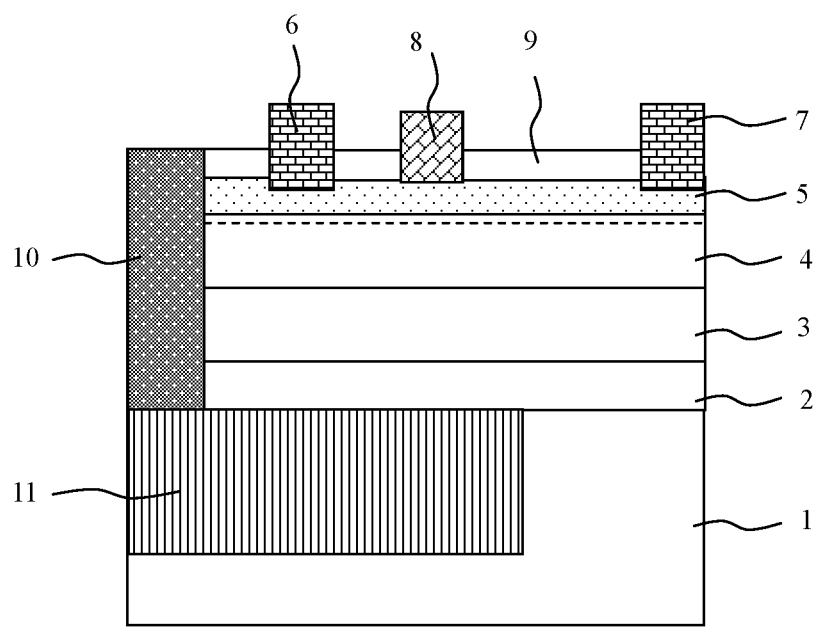
FIG.15-B

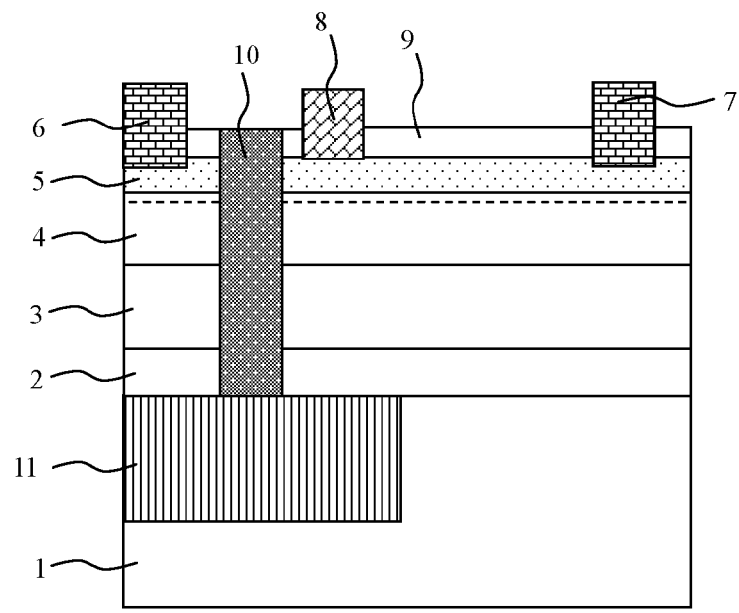
FIG.16-A
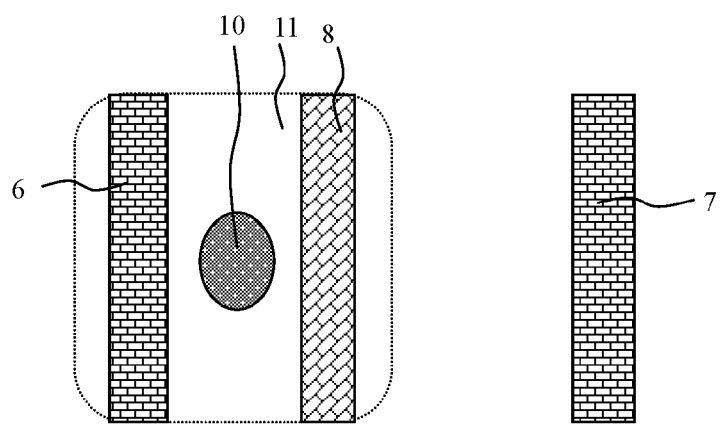
FIG.16-B

HIGH-VOLTAGE NITRIDE DEVICE AND MANUFACTURING METHOD THEREOF

CROSS-REFERENCE TO RELATED APPLICATION

This application is Continuation Application of US patent application U.S. Ser. No. 14/820,552 (filed on Aug. 6, 2015), which is Continuation-In-Part Application of PCT application Serial No. PCT/CN2014/070148 (filed on Jan. 6, 2014) which claims priority from Chinese Patent Application Serial No. 201310049853.X (filed on Feb. 7, 2013), the entire contents of which are incorporated herein by reference for all purposes.

FIELD OF THE INVENTION

The present invention is related to micro-electronics technology, and more particularly to a high-voltage nitride device and a manufacturing method thereof.

BACKGROUND OF THE INVENTION

Because of having a wide band gap, high electron saturation drift velocity, high critical electric field and high thermal conductivity, wide band gap compounds show great potential in application fields of high frequency, high temperature and high power. Especially, high-voltage nitride devices are drawing extensive attention of researchers all over the world because of their superior performance and great potential.

Conventional high-voltage nitride devices are normally manufactured by preparing a nitride epitaxial layer on a silicon substrate, and this manufacturing method is getting more and more mature. Epitaxial layer refers to that part grown and deposited on the substrate, and the nitride epitaxial layer is the nitride part of the epitaxial layer. Due to its low cost, this manufacturing method hugely promotes the marketing process of the high-voltage nitride devices.

When applying a high voltage to a high-voltage nitride device grown on a silicon substrate, the silicon substrate considered as a low resistance area is a path of the leakage current, since the critical electric field of silicon is low and the silicon material itself is electric conductive; and when the applied voltage is too high and the applied electric field exceeds the critical value, a breakdown may occur in the silicon substrate, which may further lead to a vertical breakdown of the nitride epitaxial layer. Generally speaking, the breakdown of the high-voltage nitride device grown on a silicon substrate is often caused by the vertical breakdown. When the silicon substrate is connected to ground, the breakdown voltage of the nitride devices on silicon substrate is reduced by half compared to that when the silicon substrate is floating. Although the breakdown voltage of the high-voltage nitride device with a silicon substrate mainly depends on the thickness of the nitride epitaxial layer, the nitride epitaxial layer on the silicon substrate is normally very thin, such as about 2 µm 7 µm. So the highest breakdown voltage of the high-voltage nitride device with a silicon substrate is normally less than 2000V, which is far less than the highest breakdown voltage of a high voltage nitride device grown on a SiC substrate or a sapphire substrate.

In order to increase the breakdown voltage of the high-voltage nitride device grown on a silicon substrate, the thickness of the nitride epitaxial layer and the voltage resistance of the silicon substrate may be increased. Due to the lattice and thermal mismatch between silicon and nitride layers, the thickness of the nitride epitaxial layer is greatly limited (about 2 µm 4 µm generally). In addition, a thicker epitaxial layer requires more material and more growth time, which greatly increases cost and decreases production capacity. Furthermore, the increasing of the thickness of the nitride epitaxial layer may lead to more defects including dislocations in the nitride epitaxial layer. Meantime, with the increasing of the working voltage, the leakage current can also be increased.

Another method to increase the breakdown voltage is removing the silicon substrate. However, the silicon substrate used for nitride layer growth is usually very thick (several hundred µm or even greater than 1 mm), and thus the etching process is complex and difficult. A new method to enhance the voltage resistance is required.

Since the applied voltage is generally loaded on the drain electrode of the device, the area between the gate electrode and the drain electrode is the main voltage withstanding area. Especially, when the silicon substrate is connected to ground, the area between the drain electrode and the silicon substrate electrode is the main voltage withstanding area, where the silicon substrate may breakdown more easily. To solve the above technical problems, a new high-voltage nitride device and a manufacturing method thereof are required.

SUMMARY OF THE INVENTION

In view of this, in an embodiment of the present invention, at least one region of a silicon substrate, which is below a nitride epitaxial layer and between a gate electrode and a drain electrode, is removed to form at least one spatial isolation area, so that the silicon substrate, which may cause breakdown easily, is isolated from the nitride epitaxial layer by the air in the at least one spatial isolation area. Furthermore, the at least one spatial isolation area may be filled with filling material of high critical electric field, to increase the breakdown voltage of nitride devices. The breakdown voltage of the nitride device may be further increased by oxidizing the inner sidewalls of the at least one spatial isolation area to form silicon dioxide. The at least one spatial isolation area may be formed by a wet and/or a dry etching process. In order to make the structure of the at least one spatial isolation area controllable, a dry etching process and/or a selective wet corrosion process may be applied, by which the speed of the corrosion/etching process on the lateral of the silicon substrate can be increased and the isolation effect of the at least one spatial isolation area can be improved. By forming the at least one spatial isolation area, the breakdown of the device mainly occurs through the horizontal direction of the nitride epitaxial layer, so the thickness of the nitride epitaxial layer need not be too thick, which means the device with a thinner nitride epitaxial layer can also has a high breakdown voltage. When the thickness of the nitride epitaxial layer is thin, the hole etching process in the nitride epitaxial layer can be easily controlled, in which case the production efficiency and the process controllability can be hugely improved.

One purpose of the present invention is to provide a high-voltage nitride device that can withstand a high breakdown voltage. In the structure of a device according to an embodiment of the present invention, in order to avoid the breakdown caused by a silicon substrate and increase the breakdown voltage of the device, at least one region of the silicon substrate, which is below a nitride epitaxial layer and between a gate electrode and a drain electrode, is removed to form at least one spatial isolation area. So the silicon substrate, which may cause breakdown easily, is isolated from the nitride epitaxial layer by the air in the at least one spatial isolation area. Since the area between the gate electrode and the drain electrode is the main voltage withstanding area, breakdown mainly occurs in the silicon substrate of this area. A selective corrosion process and/or an etching process may be applied to form the at least one spatial isolation area. The at least one spatial isolation area can block the conduction path and the breakdown path in the silicon substrate, so the breakdown of the device can only occur through the nitride epitaxial layer horizontally, rather than through the silicon substrate vertically. Since the breakdown voltage of the nitride epitaxial layer is normally high and the spacing between the drain electrode and the gate electrode is normally large, the breakdown voltage of the device can be largely improved if the breakdown of the device only occurs through the nitride epitaxial layer horizontally. Even the silicon substrate is connected to ground; the breakdown voltage of the device will not be reduced. Furthermore, the breakdown voltage of the device can be further increased by filling the at least one spatial isolation area with filling material of high critical electric field, and/or oxidizing the inner sidewalls of the at least one spatial isolation area to form silicon dioxide.

Another purpose of the present invention is to provide a method for manufacturing the device described above. Specifically, at least one etched hole is prepared in the nitride epitaxial layer, which may be located inside/outside the drain electrode horizontally, or inside/outside the source electrode of the device horizontally. An etching process is implemented in the etched hole to remove the nitride epitaxial layer until the silicon substrate is exposed, and then a selective corrosion process and/or a dry etching process is implemented to form at least one spatial isolation area, the prepared structure of which can be controlled to form a specific shape according to the process requirements and the device design, such as square shape, trapezoidal shape, shape with an arced edge, U-shape and so on. Furthermore, the breakdown voltage of the device can be further increased by filling the at least one spatial isolation area with filling material of a high critical electric field, and/or oxidizing the inner sidewalls of the at least one spatial isolation area to form silicon dioxide.

According to an embodiment of the present invention, a high-voltage nitride device includes:

a silicon substrate;

a nitride epitaxial layer, prepared on the silicon substrate;

a source electrode and a drain electrode, both of which are contacted with the nitride epitaxial layer;

a gate electrode, prepared between the source electrode and the drain electrode; and, at least one spatial isolation area, formed in a region between the silicon substrate and the nitride epitaxial layer vertically and between the source electrode and the drain electrode horizontally.

According to another embodiment of the present invention, a manufacturing method for a high-voltage nitride device includes:

preparing a nitride epitaxial layer on a silicon substrate provided;

preparing a source electrode and a drain electrode on the nitride epitaxial layer; both of which are contacted with the nitride epitaxial layer;

preparing a gate electrode between the source electrode and the drain electrode; forming at least one spatial isolation area in a region between the silicon substrate and the nitride epitaxial layer vertically and between the source electrode and the drain electrode horizontally.

The technical scheme of the present invention has following advantages:

By removing a part of silicon substrate below the nitride epitaxial layer and between the source electrode and the drain electrode, one or more spatial isolation areas are formed. The nitride epitaxial layer, which can withstand a high voltage, can be isolated from the part of silicon substrate due to the spatial isolation areas, so that a vertical breakdown caused by the silicon substrate can be avoided and a high-voltage nitride device with a high breakdown voltage can be achieved.

By filling the spatial isolation areas with filling material of high critical electric field strength, and by oxidizing the inner sidewalls of the spatial isolation areas, the breakdown voltage of the high-voltage nitride device can be further increased.

In order to form at least one spatial area, at least one etched hole is formed in the nitride epitaxial layer; an etching process is implemented in the at least one etched hole to remove off the nitride epitaxial layer and a part of the silicon substrate, and then a selective corrosion process and/or a dry etching process is implemented. The whole process is easy to control, and the production efficiency is greatly improved.

BRIEF DESCRIPTION OF THE DRAWINGS

FIG. 1-A and FIG. 1-B illustrate a method for preparing one or more spatial isolation areas in a region between a nitride epitaxial layer and a silicon substrate vertically and between a gate electrode and a drain electrode horizontally, in a nitride HEMT device according to an embodiment of the present invention.

FIG. 2-A and FIG. 2-B illustrate a structure of a nitride HEMT device according to an embodiment of the present invention, in which one or more spatial isolation areas are prepared by etching a hole in a nitride epitaxial layer inside of the drain electrode horizontally.

FIG. 15-A and FIG. 15-B illustrate a method for preparing a spatial isolation area in a region between a nitride epitaxial layer and a silicon substrate vertically and between a source electrode and a drain electrode horizontally, in a nitride HEMT device according to an embodiment of the present invention.

FIG. 16-A and FIG. 16-B illustrate a structure of a nitride HEMT device according to an embodiment of the present invention, in which a spatial isolation area is prepared by etching a hole in a nitride epitaxial layer inside of the source electrode horizontally.

DETAILED DESCRIPTION OF THE INVENTION

Figure 3:
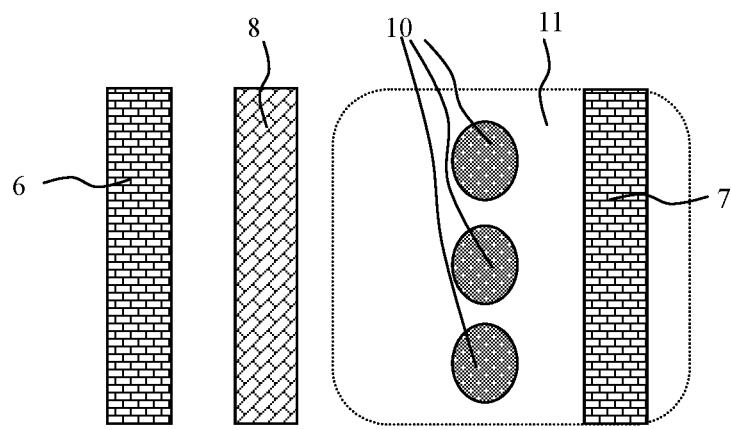
FIG. 3 illustrates a structure of a nitride HEMT device according to an embodiment of the present invention, in which one or more spatial isolation areas are prepared by forming multiple etched holes in the nitride epitaxial layer inside of the drain electrode horizontally.

In an embodiment of the present invention, a high-voltage nitride device includes:
a silicon substrate;
a nitride epitaxial layer, prepared on the silicon substrate;
a source electrode and a drain electrode, both of which are contacted with the nitride epitaxial layer;
a gate electrode, prepared between the source electrode and the drain electrode; and,
at least one spatial isolation area, formed in a region between the silicon substrate and the nitride epitaxial layer vertically and between the source electrode and the drain electrode horizontally.

In an embodiment of the present invention, the nitride epitaxial layer consists of a nitride nucleation layer, a nitride buffer layer and a nitride channel layer. Furthermore, since the area between the gate electrode and the drain electrode is the main voltage withstanding area, the at least one spatial isolation area is formed between the gate electrode and the drain electrode horizontally. In this case, the high-voltage nitride device includes:
a silicon substrate;
a nitride nucleation layer prepared on the silicon substrate;
a nitride buffer layer prepared on the nitride nucleation layer; a nitride channel layer prepared on the nitride buffer layer;
a source electrode and a drain electrode, both of which are contacted with the nitride channel layer;
a gate electrode prepared between the source electrode and the drain electrode; and,
wherein at least one spatial isolation area is formed in a region between the silicon substrate and the nitride nucleation layer vertically and between the gate electrode and the drain electrode horizontally.

In an embodiment of the present invention, the nitride epitaxial layer may further include a barrier layer prepared on the nitride channel layer.

Since the nitride nucleation layer, the nitride buffer layer, the nitride channel layer and the nitride barrier layer are all made of nitride, and prepared above the silicon substrate; the term "nitride epitaxial layer" is used for collectively representing the above 3 or 4 nitride layers for simplicity in the following description. Specifically, the nitride epitaxial layer may consist of the nitride nucleation layer, the nitride buffer layer, the nitride channel layer and the nitride barrier layer; or consist of the nitride nucleation layer, the nitride buffer layer and the nitride channel layer, if the nitride barrier layer is not prepared in a structure according to an embodiment.

In an embodiment of the present invention, a manufacturing method for a high-voltage nitride device includes:
a nitride epitaxial layer is prepared on a silicon substrate provided;
a source electrode and a drain electrode are prepared on the nitride epitaxial layer; both of which are contacted with the nitride epitaxial layer;
a gate electrode is prepared between the source electrode and the drain electrode; and,
at least one spatial isolation area is formed in a region between the silicon substrate and the nitride epitaxial layer vertically and between the source electrode and the drain electrode horizontally.

In another embodiment of the present invention, the manufacturing method of a high-voltage nitride device provided includes:
a silicon substrate is provided;
a nitride nucleation layer is prepared on the silicon substrate;
a nitride buffer layer is prepared on the nitride nucleation layer; a nitride channel layer is prepared on the nitride buffer layer;

a source electrode and a drain electrode are prepared on the nitride channel layer both of which are contacted with the nitride channel layer;

a gate electrode is prepared between the source electrode and the drain electrode; and, at least one spatial isolation area is formed in a region between the nitride nucleation layer and the silicon substrate vertically and between the gate electrode and the drain electrode horizontally.

In the technical scheme of the present invention, by removing at least one region of the silicon substrate, which is below the nitride epitaxial layer vertically and between the gate electrode and the drain electrode horizontally, the nitride epitaxial layer, which can withstand a high voltage, can be isolated from the silicon substrate in the at least one region, so that a vertical breakdown caused by the silicon substrate can be avoided and a high-voltage nitride device with a high breakdown voltage can be achieved.

The embodiments of the present invention are described more fully hereinafter with reference to the accompanying drawings, which form a part hereof, and which show, by way of illustration, specific exemplary embodiments by which the invention may be practiced. Under the principle and the novel feature of the present invention, any modifications of structures, methods or functions are all considered to be within the protection scope of the present invention.

In addition, the same reference signs or symbols may be repeatedly used in different embodiments for clarity and simplicity. However, these reference signs or symbols repeatedly used cannot be used to limit the relationships of structures in different embodiments.

FIG. 1-A and FIG. 1-B illustrate a method for preparing one or more spatial isolation areas in a region between a nitride epitaxial layer and a silicon substrate vertically and between a gate electrode and a drain electrode horizontally, in a nitride HEMT device according to an embodiment of the present invention. As shown in FIG. 1-A and FIG. 1-B, the method includes following steps.

A silicon substrate 1 is prepared as a bottom layer.

A nitride nucleation layer 2 and a nitride buffer layer 3 are prepared on the silicon substrate 1 as epitaxial layers. The nitride buffer layer 3 is used for matching substrate material and an epitaxial gallium (GaN) nitride layer with high quality. In an embodiment of the present invention, the nitride buffer layer 3 may be made of GaN, AlN or other nitride.

A nitride channel layer 4 which may include an undoped GaN layer is prepared on the nitride buffer layer 3.

A nitride barrier layer 5 is prepared on the nitride channel layer 4. Thus a semiconductor heterostructure is formed by the nitride barrier layer 5 and the nitride channel layer 4, two-dimensional electron gas with high electron concentration is formed at the interface of the semiconductor heterostructure, and a conduction channel is formed at the interface between the nitride barrier layer 5 and the nitride channel layer 4. In an embodiment of the present invention, the nitride barrier layer 5 may be made of AlGaN or other nitride.

A dielectric layer 9 is prepared on the nitride barrier layer 5 to perform as a passivation layer for protecting the surface of the nitride epitaxial layer. In an embodiment of the present invention, the dielectric layer 9 may be made of any selected from a group consisting of SiN, SiO2, SiON, Al2O3, HfO2, HfAlOx and combinations thereof. In an embodiment of the present invention, the dielectric layer 9 may be prepared through a depositing process.

A groove is etched on the dielectric layer 9 at an area between the drain electrode 6 and the source electrode 7, and the gate electrode 8 is prepared by depositing metal in the groove.

One or more spatial isolation areas 11 are prepared in a region between the nitride nucleation layer 2 and the silicon substrate 1 vertically and between the gate electrode 8 and the drain electrode 7 horizontally. At least one etched hole 10 is formed by etching at least one hole from the dielectric layer 9 to the silicon substrate 1 vertically and outside the drain electrode 7 horizontally, as shown in FIG. 1-A. Then one or more spatial isolation areas 11 are formed by implementing a dry etching process and/or a selective wet corrosion process in a region between the silicon substrate 1 and the nitride nucleation layer 2 vertically and between the gate electrode 8 and the drain electrode 7 horizontally, as shown in FIG. 1-B. In the above preparing processes of the one or more spatial isolation areas 11, the length and width of the one or more spaced isolation areas 11 may be adjusted according to the withstanding voltage required.

Those skilled in the art can understand that, the number of the spatial isolation areas 11 may be adjusted according to the withstanding voltage required. The number of the spatial isolation areas 11 cannot be used for limiting the protection scope of the present invention.

By forming one or more spatial isolation areas 11 in the region between the nitride nucleation layer 2 and the silicon substrate 1 vertically and between the gate electrode 8 and the drain electrode 7 horizontally, the nitride epitaxial layer between the gate electrode 8 and the drain electrode 7 can be locally isolated from the silicon substrate, so that the conduction path and the breakdown path through the silicon substrate 1 are blocked, and the breakdown of the device is not a vertical breakdown caused by the silicon substrate but a horizontal breakdown in the nitride epitaxial layer. Because of the high breakdown field strength of the nitride epitaxial layer and the large spacing between the gate electrode 6 and the drain electrode 7, the breakdown voltage of the high-voltage nitride device can be greatly increased, and cannot be affected even when the silicon substrate 1 is connected to ground.

FIG. 2-A and FIG. 2-B illustrate a structure of a nitride HEMT device according to an embodiment of the present invention, in which one or more spatial isolation areas are prepared by etching a hole in a nitride epitaxial inside of the drain electrode horizontally. As shown in FIG. 2-A and FIG. 2-B, the method includes following steps.

An etched hole 10 is formed by etching a hole in the nitride epitaxial layer inside of the drain electrode 7 horizontally; then by implementing an etching process and/or a selective wet corrosion process in the etched hole 10 laterally, one or more spatial isolation areas 11 are prepared in a region between a nitride nucleation layer 2 and a silicon substrate 1 vertically and between a gate electrode 8 and a drain electrode 7 horizontally, as shown in FIG. 2-A. Compared with the preparing process according to the embodiment of FIG. 1, the etching/corrosion range of the one or more spatial isolation area 11 is increased and the process time is decreased. Furthermore, the size of the etched hole 10 is limited and two-dimensional electron gas will not be severely affected, as shown in FIG. 2-B.

FIG. 3 illustrates a structure of a nitride HEMT device according to an embodiment of the present invention, in which one or more spatial isolation areas are prepared by forming multiple etched holes in the nitride epitaxial layer inside of the drain electrode horizontally.

As shown in FIG. 3, multiple etched holes 10 may be formed by etching holes in a nitride epitaxial layer inside of a drain electrode 7 horizontally; then by implementing an etching/corrosion process in each etched hole laterally, one or more spatial isolation areas 11 are prepared in a region between a nitride nucleation layer 2 and a silicon substrate 1 vertically and between a gate electrode 8 and a drain electrode 7 horizontally, as shown in FIG. 3. Compared with the preparing process according to the embodiment of FIG. 2-A and FIG. 2-B, by preparing the multiple etched holes 10, the etching/corrosion range to form the one or more spatial isolation areas 11 is increased; the process time is decreased and the performance of the nitride HEMT device is not severely affected. In an embodiment of the present invention, the multiple etched holes 10 may be arranged linearly or in other forms.

Figure 4:
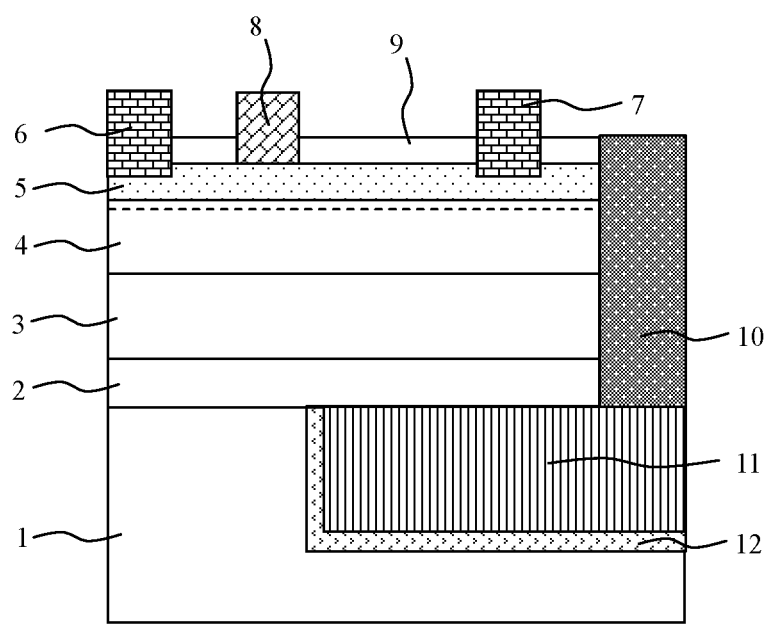
FIG. 4 illustrates a structure of a nitride HEMT device according to an embodiment of the present invention, in which a silicon dioxide layer that can withstand a high breakdown voltage is prepared in a spatial isolation area which is prepared in a region between a nitride epitaxial layer and a silicon substrate vertically.

FIG. 4 illustrates a structure of a nitride HEMT device according to an embodiment of the present invention, in which a silicon dioxide layer that can withstand a high breakdown voltage is prepared in a spatial isolation area which is prepared in a region between a nitride epitaxial layer and a silicon substrate vertically.

As shown in FIG. 4, a thick silicon dioxide layer 12 that can withstand a high voltage may be prepared by oxidizing the inner sidewalls of a spatial isolation area 11, which is prepared between a nitride epitaxial layer and a silicon substrate 1. Compared with forming spatial isolation merely by the spatial isolation area 11, the preparation of the silicon dioxide layer 12 can further improve the effect of the spatial isolation and increase the breakdown voltage of the device. The thickness of the silicon dioxide layer may be adjusted according to the withstanding voltage required and processes applied. In an embodiment of the present invention, the oxidation process for preparing the silicon oxidation layer may be a thermal oxidation process, a plasma oxidation process or another oxidation process.

Figure 5:
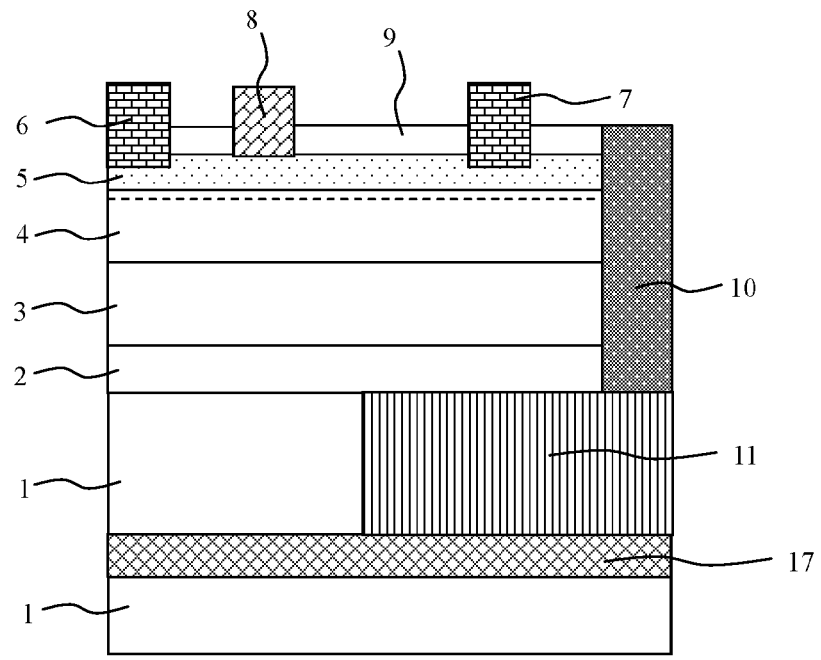
FIG. 5 illustrates a structure of a nitride HEMT device according to an embodiment of the present invention, in which an insulating layer that can withstand a high breakdown voltage is prepared at the bottom of a spatial isolation area which is prepared in a region between a nitride epitaxial layer and a silicon substrate vertically.

FIG. 5 illustrates a structure of a nitride HEMT device according to an embodiment of the present invention, in which an insulating layer that can withstand a high breakdown voltage is prepared at the bottom of a spatial isolation area which is prepared in a region between a nitride epitaxial layer and a silicon substrate vertically.

As shown in FIG. 5, an insulating layer 17, which has high breakdown field strength and can withstand a high voltage, may be prepared at the bottom of a spatial isolation area 11 and across the whole silicon substrate 1, so that the vertical breakdown voltage of the device may be further increased. In an embodiment of the present invention, the insulating layer 17 may be made of any selected from a group consisting of nitride, oxide and combination thereof.

Figure 6:
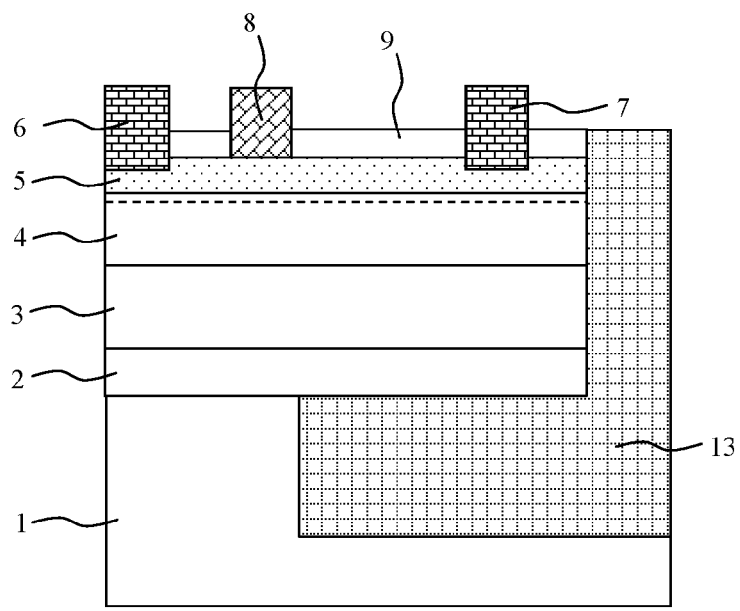
FIG. 6 illustrates a structure of a nitride HEMT device according to an embodiment of the present invention, in which a spatial isolation area, which is prepared in a region between a nitride epitaxial layer and a silicon substrate vertically, is filled with filling material that can withstand a high breakdown voltage.

FIG. 6 illustrates a structure of a nitride HEMT device according to an embodiment of the present invention, in which a spatial isolation area, which is prepared in a region between a nitride epitaxial layer and a silicon substrate vertically, is filled with filling material that can withstand a high breakdown voltage.

As shown in FIG. 6, in order to further improve the spatial isolation effect and avoid air breakdown in the spatial isolation area, the spatial isolation area 11 may be filled with filling material 13 that can withstand a high voltage. In an embodiment of the present invention, the filling material 13 may be made of any selected from a group consisting of Al2O3, SiO2, SiN, AN, diamond, other material with high critical electric field strength and combinations thereof. Especially, AlN, diamond or other material having both of high critical electric field strength and high thermal conductivity are preferably used as the filling material 13 to improve the spatial isolation effect and increase the breakdown voltage of the nitride HEMT device.

Figure 7:
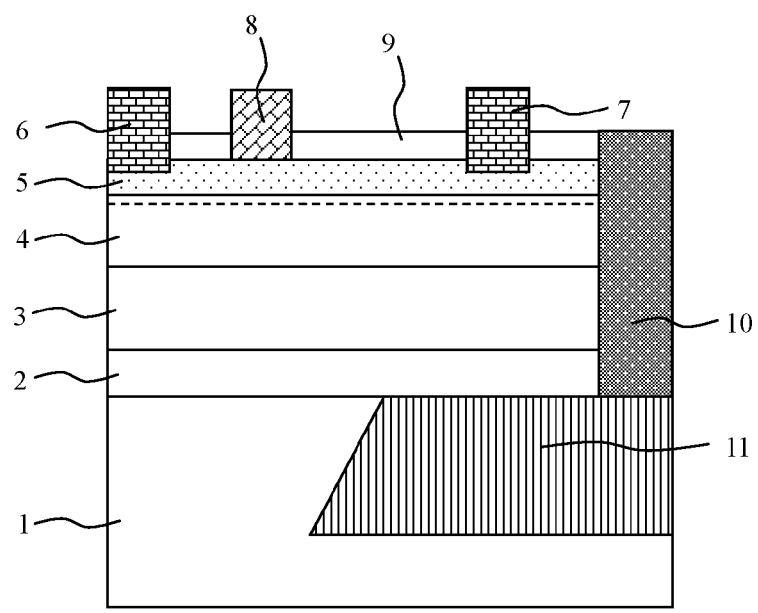
FIG. 7 illustrates a structure of a nitride HEMT device according to an embodiment of the present invention, in which a spatial isolation area, which is prepared in a region between a nitride epitaxial layer and a silicon substrate vertically, is formed as a trapezoid shape.

FIG. 7 illustrates a structure of a nitride HEMT device according to an embodiment of the present invention, in which a spatial isolation area, which is prepared in a region between a nitride epitaxial layer and a silicon substrate vertically, is formed as a trapezoid shape.

As shown in FIG. 7, the distance between a gate electrode 8 and a source electrode 6 may be much less than the distance between the gate electrode 8 and a drain electrode 7. When the horizontal length of a spatial isolation area 11 between a nitride epitaxial layer and a silicon substrate is too large, the supporting strength coming from the remaining silicon substrate may be too weak to sustain the weight of the nitride epitaxial layer, and the nitride epitaxial layer may be collapsed. To solve the problem mentioned above, the spatial isolation area 11 may be formed as a trapezoid shape to enhance the supporting strength coming from the remaining silicon substrate, on the basis of ensuring spatial isolation effect.

Figure 8:
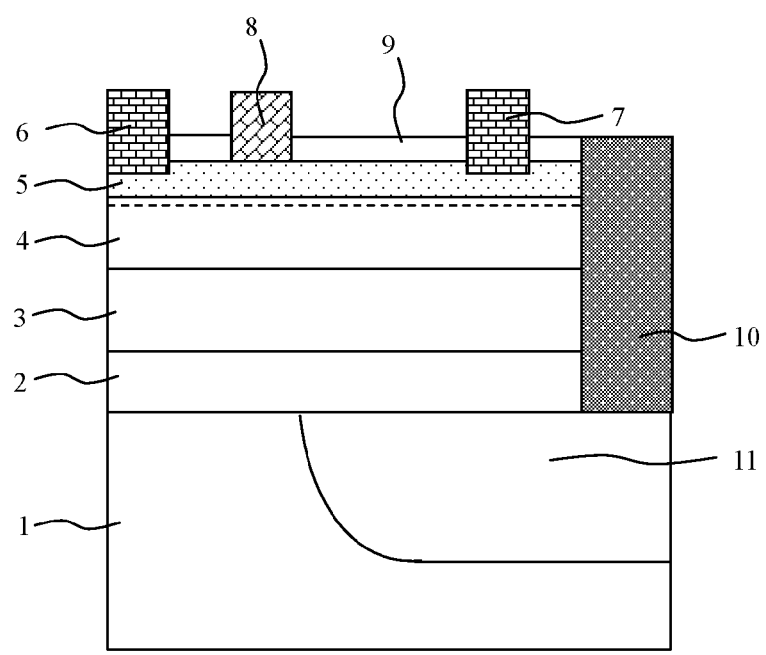
FIG. 8 illustrates a structure of a nitride HEMT device according to an embodiment of the present invention, in which a spatial isolation area, which is prepared in a region between a nitride epitaxial layer and a silicon substrate vertically, is formed as a shape with an arced edge.

FIG. 8 illustrates a structure of a nitride HEMT device according to an embodiment of the present invention, in which a spatial isolation area, which is prepared in a region between a nitride epitaxial layer and a silicon substrate vertically, is formed as a shape with an arced edge.

As shown in FIG. 8, a spatial isolation area 11 is formed as a shape with an arced edge, the preparing process of which is easy to be achieved compared with the trapezoid shape shown in FIG. 7.

Those skilled in the art can understand that, the shape of the spatial isolation area 11 may be adjusted according to the process difficulty and structure strength requirements. In an embodiment of the present invention, the spatial isolation area 11 may also be formed as a square shape or a U-shape. The specific shape of the spatial isolation area 11 cannot be used for limiting the protection scope of the present invention.

Figure 9:
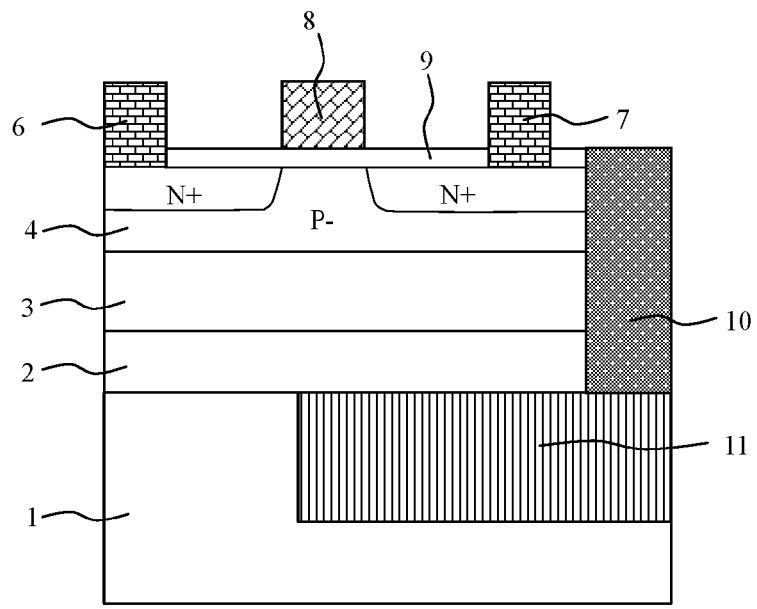
FIG. 9 illustrates a structure of a nitride MOSFET device according to an embodiment of the present invention, in which a spatial isolation area is prepared in a region between a nitride epitaxial layer and a silicon substrate vertically and between a gate electrode and a drain electrode horizontally.

FIG. 9 illustrates a structure of a nitride MOSFET device according to an embodiment of the present invention, in which a spatial isolation area is prepared in a region between a nitride epitaxial layer and a silicon substrate vertically and between a gate electrode and a drain electrode horizontally.

As shown in FIG. 9, two regions of a nitride channel layer 4 respectively below a source electrode 6 and below a drain electrode 7 may be heavily n-type-doped (normally silicon doped); a region of the nitride channel layer below the gate electrode 8 may be lightly p-type-doped (normally magnesium doped); a dielectric layer below the gate electrode 8 may be made of any one of SiO2, SiN, AN, Al2O3 and other insulation dielectric.

Figure 10:
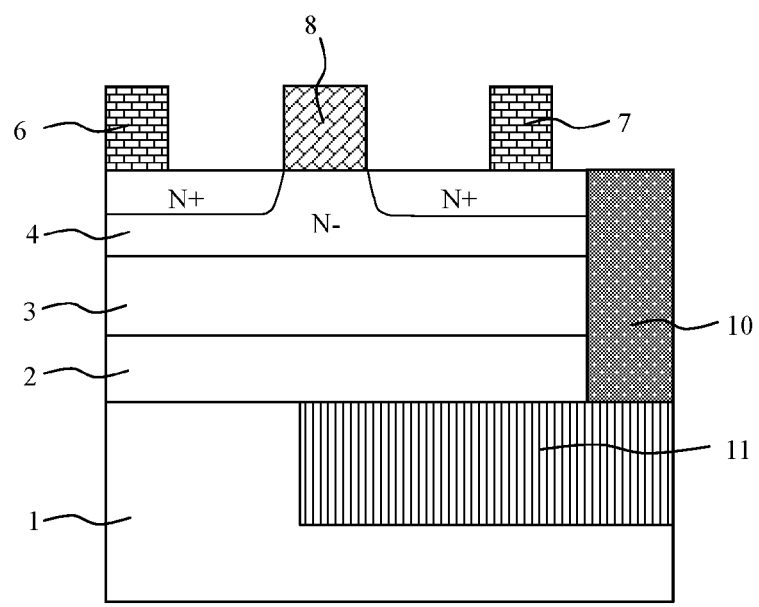
FIG. 10 illustrates a structure of a nitride MESFET device according to an embodiment of the present invention, in which a spatial isolation area is prepared in a region between a nitride epitaxial layer and a silicon substrate vertically and between a gate electrode and a drain electrode horizontally.

FIG. 10 illustrates a structure of a nitride MESFET device according to an embodiment of the present invention, in which a spatial isolation area is prepared in a region between a nitride epitaxial layer and a silicon substrate vertically and between a gate electrode and a drain electrode horizontally.

As shown in FIG. 10, different from the structure illustrated in FIG. 9, the region of the nitride channel layer 4 below the gate electrode 8 may be lightly n-type-doped; the two regions of the nitride channel layer 4 respectively below the source electrode 6 and below the drain electrode 7 may be heavily n-type-doped; the gate electrode 8 may be a Schottky junction.

Figure 11:
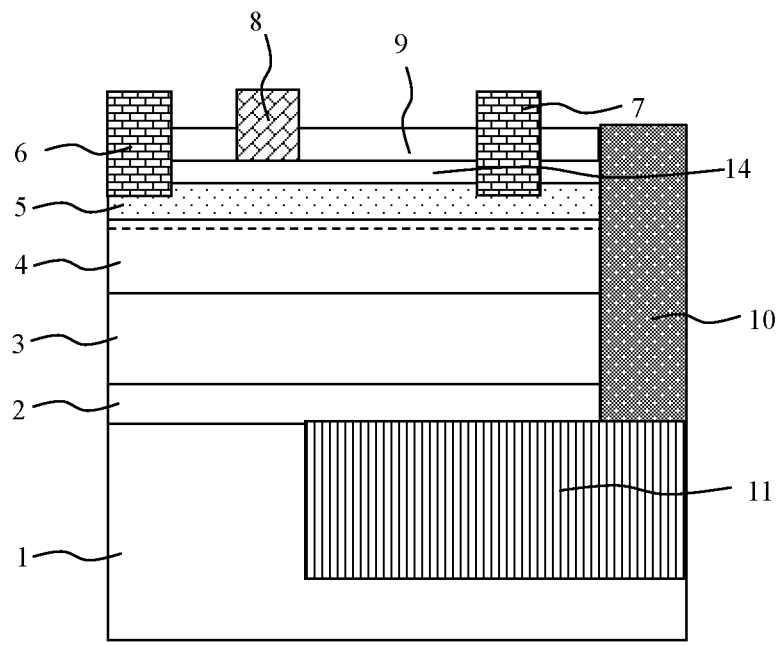
FIG. 11 illustrates a structure of a nitride HEMT device according to an embodiment of the present invention, in which a GaN cap layer is prepared on a nitride barrier layer.

FIG. 11 illustrates a structure of a nitride HEMT device according to an embodiment of the present invention, in which a GaN cap layer is prepared on a nitride barrier layer.

As shown in FIG. 11, a nitride cap layer 14 is prepared on a nitride bather layer 5 which may be made of AlGaN.

Because of the defects existing on the surface of the nitride barrier layer 5 and the large density of surface states, many electrons may be trapped and the two-dimensional electron gas in the nitride channel may be affected, which may decrease the performance and reliability of the nitride HEMT device. By preparing the nitride cap layer to protect the surface of the nitride barrier layer 5, the performance of the nitride HEMT device may not be severely affected by the defects existing on the surface of the nitride barrier layer 5 and the surface states. In an embodiment of the present invention, the nitride cap layer 14 may be made of GaN.

In an embodiment of the present invention, a dielectric layer 9 is prepared on the nitride barrier layer 5, thus the nitride cap layer 14 is prepared between the nitride barrier layer 5 and the dielectric layer 9.

Figure 12:
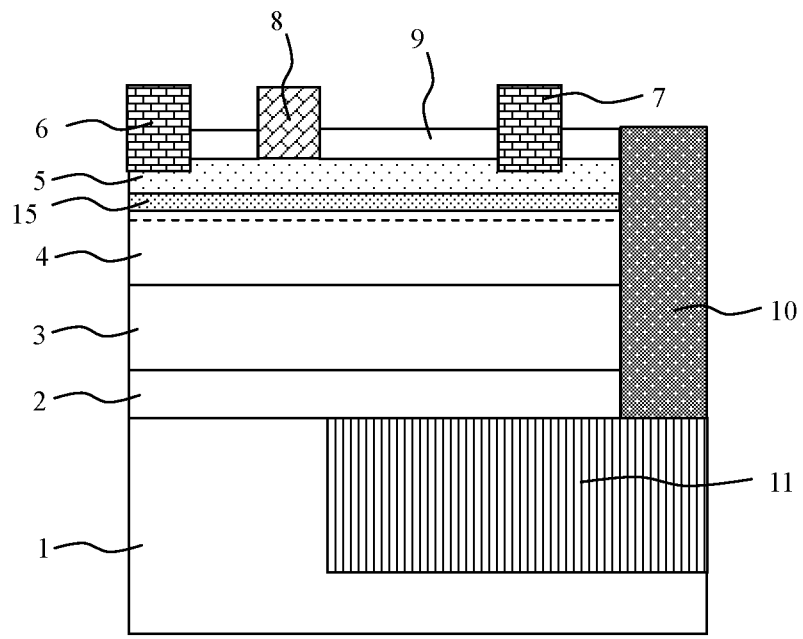
FIG. 12 illustrates a structure of a nitride HEMT device according to an embodiment of the present invention, in which an AlN spacer is prepared between a nitride barrier layer and a nitride channel layer.

FIG. 12 illustrates a structure of a nitride HEMT device according to an embodiment of the present invention, in which an AlN spacer is prepared between a nitride barrier layer and a nitride channel layer.

As shown in FIG. 12, an AlN spacer 15 may be prepared between a nitride barrier layer 5 and a nitride channel layer 4. The nitride barrier layer 5 may be made of AlGaN. Since the band gap of AlN is very large, electrons can be limited in the heterojunction potential well more effectively, and the concentration of the two-dimensional electron gas can be increased. Furthermore, the conduction channel can be isolated from the nitride barrier layer 5 by the AlN spacer, so the scattering effect to electrons by the nitride barrier layer is reduced, and then the mobility of the electrons is increased, which improves the performance of the nitride HEMT device.

Figure 13:
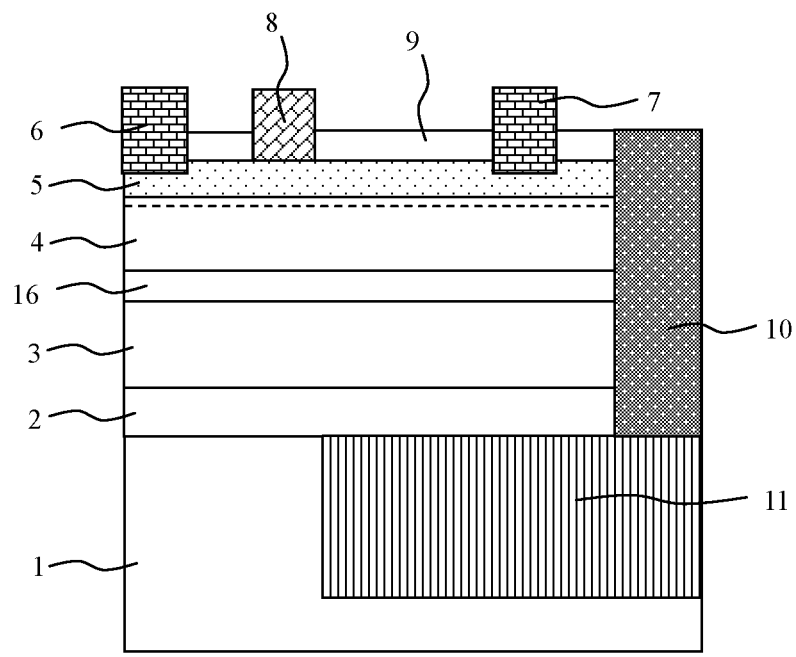
FIG. 13 illustrates a structure of a nitride HEMT device according to an embodiment of the present invention, in which an AlGaN back barrier layer is prepared between a nitride buffer layer and a nitride channel layer.

FIG. 13 illustrates a structure of a nitride HEMT device according to an embodiment of the present invention, in which an AlGaN back barrier layer is prepared between a nitride buffer layer and a nitride channel layer.

When a certain voltage is applied, electrons in a conduction channel may enter into a nitride buffer layer 3, and more electrons may enter if the conduction channel is short, which is called short-channel effect. The short-channel effect may weaken the control of the electrons in the conduction channel by the gate electrode. Furthermore, the two-dimensional electron gas in the conduction channel may be affected by the defects and impurities in the nitride, which may lead to current collapse. In an embodiment of the present invention, as shown in FIG. 13, an AlGaN back barrier layer 16 may be prepared between a nitride buffer layer 3 and a nitride channel layer 4, so the electrons in the conduction channel may be isolated from the nitride buffer layer 3, and the two-dimensional electron gas may be limited in the nitride channel layer 4, which can reduce the short-channel effect and avoid current collapse.

Figure 14:
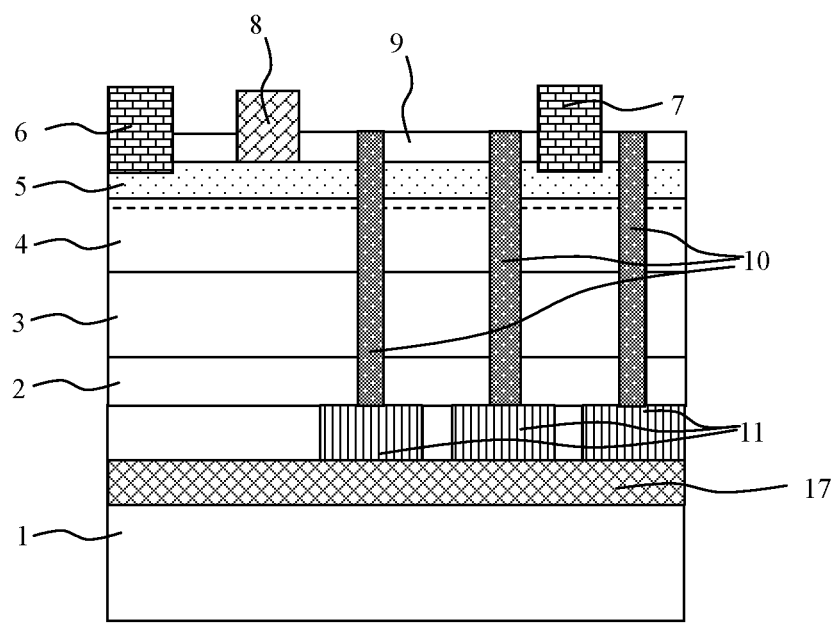
FIG. 14 illustrates a structure of a nitride HEMT device according to an embodiment of the present invention, in which multiple spatial isolation areas are prepared by forming multiple etched holes close to a drain electrode, and an insulating layer that can withstand a high voltage is prepared at the bottom of the spatial isolation areas.

FIG. 14 illustrates a structure of a nitride HEMT device according to an embodiment of the present invention, in which multiple spatial isolation areas are prepared by forming multiple etched holes close to a drain electrode, and an insulating layer that can withstand a high voltage is prepared at the bottom of the spatial isolation areas.

As shown in FIG. 14, multiple etched holes 10 are formed close to a drain electrode 7; multiple spatial isolation areas 11 are formed in a region between the nitride nucleation layer 2 and the silicon substrate 1 vertically; and an insulating layer 17 that can withstand a high voltage (such as silicon dioxide layers) is prepared at the bottom of the spatial isolation areas 11. In this case, both of the horizontal withstanding voltage and the vertical withstanding voltage of the nitride HEMT device are increased, so that the general breakdown voltage of the device is increased; meantime, compared with merely forming one large spatial isolation area below the drain electrode 7, the efficiency of the corrosion/etching process applied in the spatial isolation areas is greatly improved. Furthermore, the silicon substrate between each two spatial isolation areas can provide supporting strength to avoid collapses, which may be caused if some spatial isolation area is too large. By oxidizing the inner sidewalls of the spatial isolation areas or filling the spatial isolation areas with filling material with high withstanding voltage, the breakdown voltage of the device can be further increased.

FIG. 15-A and FIG. 15-B illustrate a method for preparing a spatial isolation area in a region between a nitride epitaxial layer and a silicon substrate vertically and between a source electrode and a drain electrode horizontally, in a nitride HEMT device according to an embodiment of the present invention.

As shown in FIG. 15-A and FIG. 15-B, a spatial isolation area 11 is formed in a region between a nitride nucleation layer 2 and a silicon substrate 1 vertically and between the source electrode 6 and the drain electrode 7 horizontally. Specifically, an etched hole 10 is formed by etching a hole in the nitride epitaxial layer outside of the source electrode 6 horizontally, as shown in FIG. 15-A; then by implementing a dry etching process and/or a selective wet corrosion process on a region of the silicon substrate 1 which is below the nitride epitaxial layer and between the source electrode 6 and the drain electrode 7 horizontally, a spatial isolation area 11 is formed in the region between the nitride nucleation layer 2 and the silicon substrate 1 vertically and between the source electrode 6 and the drain electrode 7 horizontally, as shown in FIG. 15-B. In the above preparing processes of the spatial isolation area 11, the length and width of the spatial isolation area 11 may be adjusted according to the withstanding voltage required.

FIG. 16-A and FIG. 16-B illustrate a structure of a nitride HEMT device according to an embodiment of the present invention, in which a spatial isolation area is prepared by etching a hole in a nitride epitaxial layer inside of the source electrode horizontally.

As shown in FIG. 16-A and FIG. 16-B, an etched hole 10 is formed by etching a hole in a nitride epitaxial layer inside of the source electrode 6 horizontally; then a spatial isolation area 11 is formed by implementing an etching/corrosion process in the etched hole 10 laterally, as shown in FIG. 16-A. Compared with the preparing process according to the embodiment of FIG. 15-A and FIG. 15-B, the etching/corrosion range of the spatial isolation area 11 is increased and the process time is decreased. Furthermore, the size of the etched hole 10 is limited and two-dimensional electron gas cannot be severely affected, the etched hole 10 need not be very large, as shown in FIG. 16-B. In an embodiment of the present invention, multiple etched holes 10 may be formed between the source electrode 6 and the gate electrode 8. The multiple etched holes 10 may be arranged linearly or in other forms, In this case, the etching/corrosion range of the spatial isolation area 11 can be further increased, the process time can be further decreased and the performance of the nitride HEMT device will not be severely affected.

In another embodiment of the present invention, a high-voltage nitride device with a high breakdown voltage may also be formed by changing the preparing processes of the device, or changing the structure of the nitride channel layer or the barrier layer, such as implementing a fluorinion bombardment process on the material area below the gate electrode and so on.

The high-voltage nitride devices mentioned in above embodiments are all transistors. In an embodiment of the present invention, the high-voltage nitride device also may be a kind of diode device. In this case, one or more spatial isolation areas may be prepared in a region between a nitride epitaxial layer and a silicon substrate of the diode device vertically and between a positive electrode and a negative electrode of the diode device horizontally. The detailed preparing process of the one or more spatial isolation areas in a diode device may be the same with that applied in above embodiments of transistors. Moreover, in order to further increase the breakdown voltage of the diode device, the one or more spatial isolation areas in the diode device also may be filled with filling material that can withstand a high breakdown voltage; the inner sidewalls of the one or more spatial isolation areas also may be oxidized; and an insulating layer that can withstand a high breakdown voltage also may be prepared at the bottom of the one or more spatial isolation areas in the diode device.

The embodiments of diode devices are described hereinafter with reference to the following two drawings.

Figure 17:
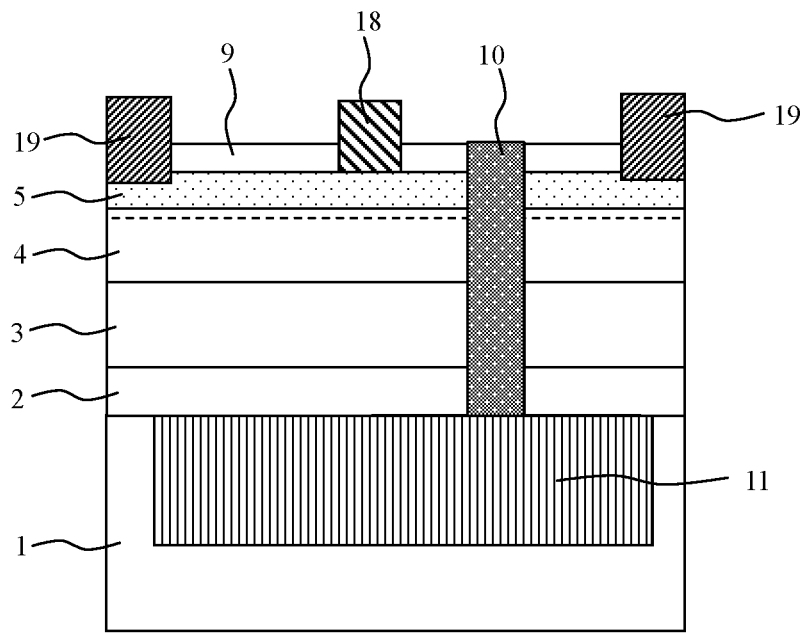
FIG. 17 illustrates a structure of a schottcky diode device according to an embodiment of the present invention, in which one or more spatial isolation areas are prepared in a region between a nitride epitaxial layer and a silicon substrate vertically and between a positive electrode and a negative electrode horizontally.

FIG. 17 illustrates a structure of a schottcky diode device according to an embodiment of the present invention, in which one or more spatial isolation areas are prepared in a region between a nitride epitaxial layer and a silicon substrate vertically and between a positive electrode and a negative electrode horizontally.

As shown in FIG. 17, the schottcky diode device includes: a silicon substrate 1, a nitride epitaxial layer prepared on the silicon substrate 1, a positive electrode 18 and a negative electrode 19. The positive electrode 18 and the negative electrode 19 are contacted with the nitride epitaxial layer. One or more spatial isolation areas 11 are prepared in a region between the nitride epitaxial layer and the silicon substrate 1 vertically and between the positive electrode 18 and the negative electrode 19 horizontally. Specifically, the one or more spatial isolation areas 11 may be prepared by forming one or more etched holes 10 in the nitride epitaxial layer between the positive electrode 18 and the negative electrode 19 horizontally, and then implementing etching/corrosion processes in the one or more etched holes 10 laterally.

In an embodiment of the present invention, the nitride epitaxial layer may include: a nitride nucleation layer 2 prepared on the silicon substrate 1, a nitride buffer layer 3 prepared on the nitride nucleation layer 2, a nitride channel layer 4 prepared on the nitride buffer layer 3, a nitride barrier layer 5 prepared on the nitride channel layer 4 and a dielectric layer 9 prepared on the nitride barrier layer 5 to perform as a passivation layer for protecting the surface of the nitride epitaxial layer. In this case, the positive electrode 18 and the negative electrode 19 are contacted with the nitride barrier layer 5 practically.

Figure 18:
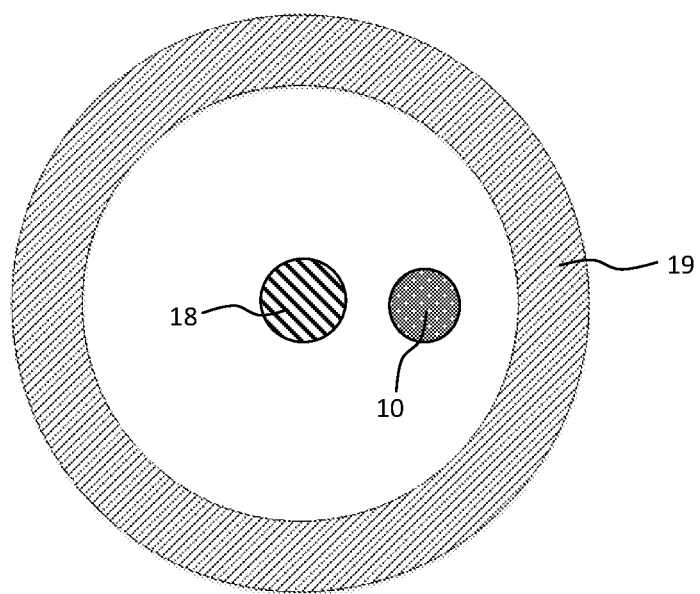
FIG. 18 is a top plan view of the structure illustrated in FIG. 17.

In an embodiment of the present invention, as shown in FIG. 18, the negative electrode 19 may be in a shape of a ring, and the positive electrode 18 may be prepared inside the ring.

Figure 19:
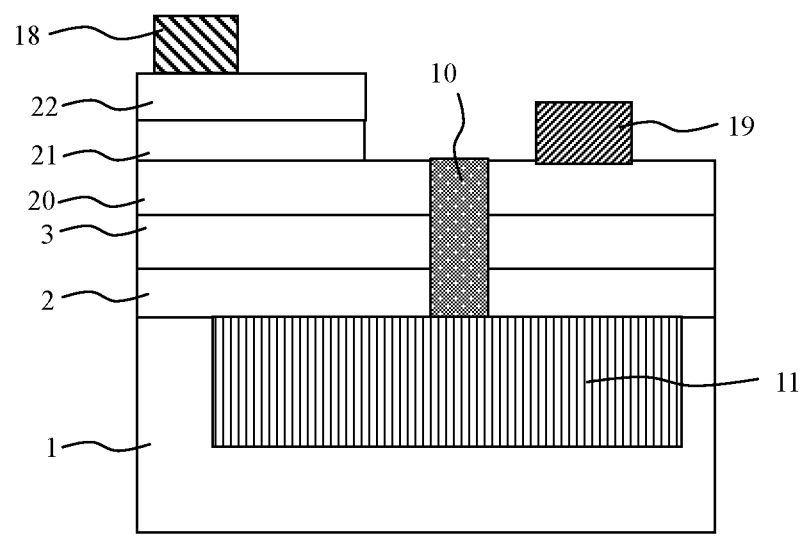
FIG. 19 illustrates a structure of a PIN diode device according to an embodiment of the present invention, in which one or more spatial isolation areas are prepared in a region vertically between a nitride epitaxial layer and a silicon substrate and horizontally crossing a positive electrode and/or a negative electrode.

FIG. 19 illustrates a structure of a PIN diode device according to an embodiment of the present invention, in which one or more spatial isolation areas are prepared in a region vertically between a nitride epitaxial layer and a silicon substrate and horizontally under crossing a positive electrode and/or a negative electrode.

In a PIN diode device, in order to further ensure the isolation effect of the one or more spatial isolation areas 11, the one or more spatial isolation areas 11 may be prepared in a region vertically between a nitride epitaxial layer and a silicon substrate 1 and horizontally under crossing a positive electrode 18 and/or a negative electrode 19 (as shown in FIG. 19).

Furthermore, the nitride epitaxial layer in the embodiment of FIG. 19 includes: a nitride nucleation layer 2 prepared on a silicon substrate 1, a nitride buffer layer 3 prepared on the nitride nucleation layer 2, a N-type GaN layer 20 prepared on the nitride buffer layer 3, an intrinsic GaN layer 21 prepared on a part of the N-type GaN layer 20 and a P-type GaN layer 22 prepared on the intrinsic GaN layer 21. A positive electrode 18 is contacted with the P-type GaN layer 22, and a negative electrode 19 is contacted with the part of the N-type GaN layer 20 exposed from the P-type GaN layer 22 and the intrinsic GaN layer 21.

In this case, the one or more spatial isolation areas 11 may be prepared by forming one or more etched holes 10, which are formed from the top of the N-type GaN layer 20 or the P-type GaN layer 22 to the silicon substrate 1 vertically and between the positive electrode 18 and the negative electrode 19 horizontally, and then implementing etching/corrosion processes in the one or more etched holes 10 laterally.

In an embodiment of the present invention, since the etching depth from the top of the N-type GaN layer 20 to the silicon substrate 1 is thinner than that from the top of the P-type GaN layer 22 to the silicon substrate 1, the etching processes of the one or more etched holes 10 are preferably implemented from the top of the N-type GaN layer 20 to the silicon substrate 1, in order to further decrease the preparing difficulty of the one or more spatial isolation areas 11.

Based on above description, it can be concluded that the technical scheme of the present invention has following advantages.

By removing a part of silicon substrate below the nitride epitaxial layer, one or more spatial isolation areas are formed. The nitride epitaxial layer, which can withstand a high voltage, can be isolated from the part of silicon substrate due to the spatial isolation areas, so that a vertical breakdown caused by the silicon substrate can be avoided and a high-voltage nitride device with a high breakdown voltage can be achieved.

By filling the spatial isolation areas with filling material with high breakdown field strength, and by oxidizing the inner sidewalls of the spatial isolation areas, the breakdown voltage of the high-voltage nitride device can be further increased.

In order to form at least one spatial area, at least one etched hole is formed in the nitride epitaxial layer; an etching process is implemented in the at least one etched hole to remove off the nitride epitaxial layer and a part of the silicon substrate, and then a selective corrosion process and/or a dry etching process is implemented. The whole process is easy to control, and the production efficiency is greatly improved.

Those skilled in the art can understand that, the present invention is not limited to the details described in above embodiments. Under the principle and the novel feature of the present invention, the present invention may also be realized in other embodiments. Therefore, all the embodiments described above should be considered as preferable examples rather than limitations of the technical scheme of the present invention, any modifications under the principle and the novel feature of the present invention are all considered to be within the protection scope of the present invention. Furthermore, the reference signs or symbols used cannot be used for limiting the protection scope of the present invention.

Those skilled in the art can also understand that, although the present invention is described with embodiments for clarity, each embodiment may include more than one technical scheme. The embodiments described in the specification should be considered as a whole. Those skilled in the art may obtain other new embodiments by combing the technical schemes described in the embodiments of the specification.

The invention claimed is:

1. A high-voltage nitride device, comprising:
   a silicon substrate;
   a nitride epitaxial layer, prepared on the silicon substrate;
   a positive electrode and a negative electrode, both of which are contacted with the nitride epitaxial layer; and
   at least one spatial isolation area, formed in a region between the silicon substrate and the nitride epitaxial layer vertically and between the positive electrode and the negative electrode horizontally.

2. The device of claim 1, wherein the nitride epitaxial layer comprises:
   a nitride nucleation layer prepared on the silicon substrate;
   a nitride buffer layer prepared on the nitride nucleation layer; and
   a nitride channel layer prepared on the nitride buffer layer.

3. The device of claim 1, wherein the at least one spatial isolation area is filled with filling material.

4. The device of claim 1, wherein the at least one spatial isolation area is formed as any one of a square shape, a trapezoid shape, a shape with an arced edge and a U-shape.

5. The device of claim 1, wherein inner sidewalls of the at least one spatial isolation area are oxidized to form silicon dioxide.

6. The device of claim 1, further comprising:
   an insulating layer, prepared at a bottom of the at least one spatial isolation area and across the whole silicon substrate.

7. The device of claim 1, wherein the negative electrode is in a shape of a ring, and the positive electrode is prepared inside the ring.

8. The device of claim 1, wherein the nitride epitaxial layer comprises:
   a nitride nucleation layer prepared on the silicon substrate;
   a nitride buffer layer prepared on the nitride nucleation layer;
   a N-type GaN layer prepared on the nitride buffer layer;
   an intrinsic GaN layer prepared on a part of the N-type GaN layer; and
   a P-type GaN layer prepared on the intrinsic GaN layer.

9. The device of claim 2, the nitride epitaxial layer further comprises:
   a nitride barrier layer, prepared on the nitride channel layer;
   wherein two-dimensional electron gas with high electron concentration is formed at an interface between the nitride barrier layer and the nitride channel layer.

10. The device of claim 2, further comprising:
    an AlGaN back barrier layer, prepared between the nitride buffer layer and the nitride channel layer.

11. The device of claim 9, further comprising:
    a dielectric layer, prepared on the nitride barrier layer.

12. The device of claim 9, wherein the nitride epitaxial layer further comprises:
    a nitride cap layer, prepared on the nitride barrier layer.

13. The device of claim 9, further comprising:
    an AlN spacer, prepared between the nitride barrier layer and the nitride channel layer.

14. The device of claim 8, wherein the positive electrode is contacted with the P-type GaN layer, and the negative electrode is contacted with the part of the N-type GaN layer exposed from the P-type GaN layer and the intrinsic GaN layer.

15. The device of claim 8, wherein the at least one spatial isolation area is formed in a region between the silicon substrate and the nitride epitaxial layer vertically and horizontally under and crossing the positive electrode and/or the negative electrode.

16. A manufacturing method of a high-voltage nitride device, comprising:
    preparing a nitride epitaxial layer on a silicon substrate provided;
    preparing a positive electrode and a negative electrode on the nitride epitaxial layer, both of which are contacted with the nitride epitaxial layer; and
    forming at least one spatial isolation area in a region between the silicon substrate and the nitride epitaxial layer vertically and between the positive electrode and the negative electrode horizontally.

17. The method of claim 16, wherein preparing a nitride epitaxial layer on a silicon substrate provided comprises:
    preparing a nitride nucleation layer on the silicon substrate;
    preparing a nitride buffer layer on the nitride nucleation layer; and preparing a nitride channel layer on the nitride buffer layer.

18. The method of claim 16, wherein preparing a nitride epitaxial layer on a silicon substrate provided comprises:
    preparing a nitride nucleation layer on the silicon substrate;
    preparing a nitride buffer layer on the nitride nucleation layer; preparing a N-type GaN layer on the nitride buffer layer; preparing an intrinsic GaN layer on a part of the N-type GaN layer; and preparing a P-type GaN layer on the intrinsic GaN layer.

19. The method of claim 17, wherein forming at least one spatial isolation area in a region between the silicon substrate and the nitride epitaxial layer vertically and between the positive electrode and the negative electrode horizontally comprises:
    forming at least one etched hole, which is located in the nitride epitaxial layer and between the positive electrode and the negative electrode horizontally; and
    implementing an etching process and/or a wet corrosion process in the at least one etched hole laterally.

20. The method of claim 18, wherein preparing a positive electrode and a negative electrode on the nitride epitaxial layer; both of which are contacted with the nitride epitaxial layer comprises:
    preparing the positive electrode on the P-type GaN layer; and
    preparing the negative electrode on the part of the N-type GaN layer exposed from the P-type GaN layer and the intrinsic GaN layer.

21. The method of claim 18, wherein forming at least one spatial isolation area in a region between the silicon substrate and the nitride epitaxial layer vertically and between the positive electrode and the negative electrode horizontally comprises:
    forming the at least one spatial isolation area in a region between the silicon substrate and the nitride epitaxial layer vertically and horizontally under and crossing the positive electrode and/or the negative electrode.

22. The method of claim 21, wherein forming the at least one spatial isolation area in a region between the silicon substrate and the nitride epitaxial layer vertically and horizontally under crossing the positive electrode and/or the negative electrode comprises:
  forming at least one etched hole, which is located in the nitride epitaxial layer and between the positive electrode and the negative electrode horizontally; and
  implementing an etching process and/or a wet corrosion process in the at least one etched hole laterally.

23. The method of claim 22, wherein forming at least one etched hole, which is located in the nitride epitaxial layer and between the positive electrode and the negative electrode horizontally comprises:
  forming at least one etched hole, which is formed from the top of the N-type GaN layer to the silicon substrate vertically and between the positive electrode and the negative electrode horizontally.

* * * * *